US012805271B2

(12) United States Patent
Ryu et al.

(10) Patent No.: US 12,805,271 B2
(45) Date of Patent: Nov. 17, 2026

(54) METHOD OF MANUFACTURING SEMICONDUCTOR DEVICE

(71) Applicant: SAMSUNG ELECTRONICS CO., LTD., Suwon-si (KR)

(72) Inventors: Hyungju Ryu, Suwon-si (KR); Sangjin Kim, Suwon-si (KR); Yigwon Kim, Suwon-si (KR); Jongsu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 18/535,594

(22) Filed: Dec. 11, 2023

(65) Prior Publication Data

US 2024/0282576 A1 Aug. 22, 2024

(30) Foreign Application Priority Data

Feb. 22, 2023 (KR) ........................ 10-2023-0023566

(51) Int. Cl.
*H10P 76/20* (2026.01)
*G03F 7/00* (2006.01)
*H10P 52/00* (2026.01)

(52) U.S. Cl.
CPC ...... *H10P 76/2041* (2026.01); *G03F 7/70625* (2013.01); *G03F 7/70633* (2013.01); *H10P 52/00* (2026.01)

(58) Field of Classification Search
CPC ........... G01N 21/9501; G01N 21/9503; G01N 21/9505; H10P 74/203; H10P 74/207;
(Continued)

(56) References Cited

U.S. PATENT DOCUMENTS 6,678,055 B2 1/2004 Du-Nour et al.
8,247,895 B2 * 8/2012 Haensch ................ B32B 37/02 257/774

(Continued)

FOREIGN PATENT DOCUMENTS

JP 5338517 B2 11/2013
KR 10-0567847 B1 4/2006

(Continued)

OTHER PUBLICATIONS

Office Action issued Aug. 19, 2026 by the Korean Ministry of Intellectual Property for KR Patent Application No. 10-2023-0023566.

*Primary Examiner* — Tucker J Wright
(74) *Attorney, Agent, or Firm* — Sughrue Mion, PLLC

(57) ABSTRACT

A method of manufacturing a semiconductor device includes bonding a first semiconductor substrate on a second semiconductor substrate; performing a first physical parameter measurement on a first surface of the first semiconductor substrate to obtain first displacement data; polishing the first surface of the first semiconductor substrate after the first displacement data is obtained; performing a second physical parameter measurement on the polished first surface of the first semiconductor substrate to obtain second displacement data; and forming circuit patterns on the polished first surface of the first semiconductor substrate based on the second displacement data.

20 Claims, 16 Drawing Sheets

(58) Field of Classification Search
CPC ........ H10P 52/20; H10P 52/202; H10P 52/40; H10P 52/402; H10P 76/2041; H10P 74/23; H10P 52/00; G03F 7/70633
See application file for complete search history.

(56) References Cited

U.S. PATENT DOCUMENTS

| | | | |
|---|---|---|---|
| 8,959,980 B2 | 2/2015 | Vodnick et al. | |
| 10,008,424 B2 | 6/2018 | Wimplinger | |
| 2013/0310966 A1 | 11/2013 | MacNaughton et al. | |
| 2022/0230947 A1 | 7/2022 | Park et al. | |
| 2024/0120215 A1 * | 4/2024 | Iga | H10P 72/0428 |

FOREIGN PATENT DOCUMENTS

| | | |
|---|---|---|
| KR | 10-1677840 B1 | 11/2016 |
| KR | 10-2021-0148855 A | 12/2021 |
| WO | 2021/019919 A1 | 2/2021 |

* cited by examiner

METHOD OF MANUFACTURING SEMICONDUCTOR DEVICE

CROSS-REFERENCE TO RELATED APPLICATIONS

This application claims priority under 35 U.S.C. § 119 to Korean Patent Application No. 10-2023-0023566, filed on Feb. 22, 2023 in the Korean Intellectual Property Office, the disclosure of which is incorporated herein by reference in its entirety.

BACKGROUND

1. Field

Example embodiments relate to a method of manufacturing a semiconductor device. More particularly, example embodiments relate to a method of manufacturing a semiconductor device having a plurality of semiconductor substrates bonded to each other.

2. Description of the Related Art

In a process of forming circuit patterns on a semiconductor substrate, a change in an overlay between circuit patterns may occur. The change in the overlay between the circuit patterns may reduce reliability of a semiconductor device. The overlay between the circuit patterns may be measured through an indirect method of irradiating light onto the semiconductor substrate. The indirect method of measuring the overlay between the circuit patterns through the light may be unreliable. Furthermore, based on the limitations of the indirect method, it is difficult to measure the overlay change in local areas.

SUMMARY

Example embodiments provide a method of manufacturing a semiconductor device using nanoindentation for measuring an overlay of circuit patterns from a local area on a semiconductor substrate.

According to one or more embodiments, a method of manufacturing a semiconductor device comprises bonding a first semiconductor substrate on a second semiconductor substrate; performing a first physical parameter measurement on a first surface of the first semiconductor substrate to obtain first displacement data; polishing the first surface of the first semiconductor substrate after the first displacement data is obtained; performing a second physical parameter measurement on the polished first surface of the first semiconductor substrate to obtain second displacement data; and forming circuit patterns on the polished first surface of the first semiconductor substrate based on the second displacement data.

According to one or more embodiments, a method of manufacturing a semiconductor device, comprises: bonding a first semiconductor substrate onto a second semiconductor substrate; performing a first physical parameter measurement on a first surface of the first semiconductor substrate to obtain first displacement data, the first displacement data indicating a residual stress of the first surface; polishing the first surface of the first semiconductor substrate after the first displacement data is obtained; performing a second physical parameter measurement on the polished first surface of the first semiconductor substrate to obtain second displacement data, the second displacement data indicating residual stress of the polished first surface; and forming circuit patterns on the polished first surface of the first semiconductor substrate based on the second displacement data.

According to one or more embodiments, a method of manufacturing a semiconductor device, comprises bonding a plurality of semiconductor substrates to each other; obtaining first displacement data indicating a residual stress of a surface from any one surface selected from among the semiconductor substrates through a physical parameter measurement; polishing the surface of the semiconductor substrate such that a displacement change applied on the surface in a process of obtaining the first displacement data is removed; obtaining second displacement data indicating a residual stress of the polished surface from the polished surface of the semiconductor substrate through the physical parameter measurement; forming circuit patterns on the polished surface of the semiconductor substrate based on the second displacement data and displacement changes that are applied on the polished surface in a process of obtaining the second displacement data; and bonding a plurality of different semiconductor substrates to each other based on the first displacement data.

According to example embodiments, in a method of manufacturing a semiconductor device, a first semiconductor substrate may be bonded onto a second semiconductor substrate. A first physical parameter measurement may be performed on a first surface of the first semiconductor substrate to obtain first displacement data. The first surface of the first semiconductor substrate may be polished. The second physical parameter measurement may be performed on the polished first surface of the first semiconductor substrate to obtain second displacement data. Circuit patterns may be formed on the polished first surface of the first semiconductor substrate based on the second displacement data.

Thus, an overlay between the first and second semiconductor substrates may be measured by the first and second physical parameter measurements. The first semiconductor substrate may have circuit elements formed on a second surface opposite to the first surface. An overlay between the circuit elements and the circuit patterns may be measured by the first and second physical parameter measurements.

Since the physical parameter measurement directly contact the first surface of the first semiconductor substrate to obtain the first and second displacement data, the overlays may be measured more accurately. The first and second physical parameter measurements may include nanoindentation. Since the nanoindentation obtains the first and second displacement data from the first surface through a plurality of probes that are disposed at narrow intervals, the first and second displacement data may be obtained from a local area.

Also, the first displacement data may be used as feedback data in a process of bonding semiconductor substrates. The first displacement data may include residual stress that is applied on the first semiconductor substrate, and accuracy of the overlay may be improved in a process of bonding the semiconductor substrates through the residual stress. The second displacement data may be used as feedforward data in a process of forming the circuit patterns on the polished first surface of the first semiconductor substrate. Reliability of the circuit patterns may be improved based on the second displacement data.

BRIEF DESCRIPTION OF THE DRAWINGS

Example embodiments will be more clearly understood from the following detailed description taken in conjunction with the accompanying drawings. The following figures represent non-limiting, example embodiments as described herein.

DETAILED DESCRIPTION OF EXAMPLE EMBODIMENTS

The embodiments described herein are non-limiting example embodiments, and thus, the disclosure is not limited thereto and may be realized in various other forms. Hereinafter, the embodiments will be explained in detail with reference to the accompanying drawings.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
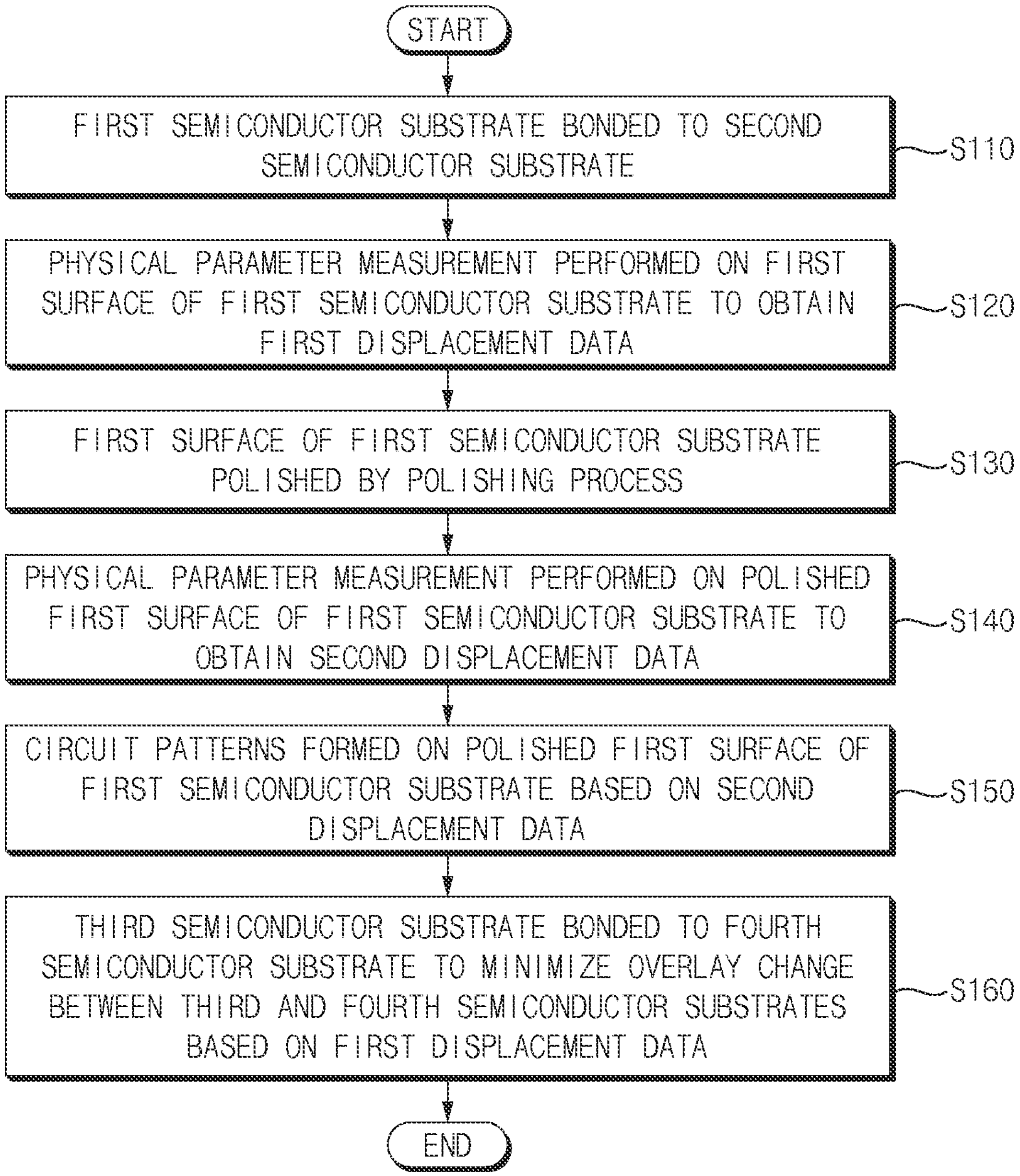
FIG. 1 is a flowchart illustrating a method of manufacturing a semiconductor device in accordance with example embodiments.
Figure 2:
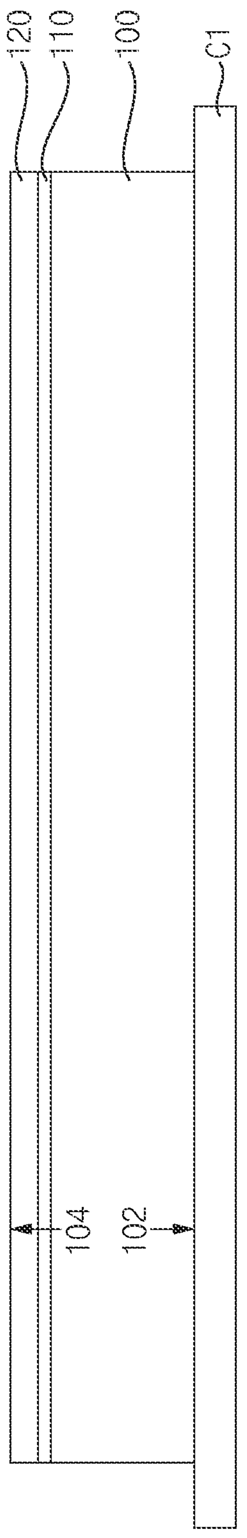
FIG. 2 is a front view illustrating a first semiconductor substrate.
Figure 3:
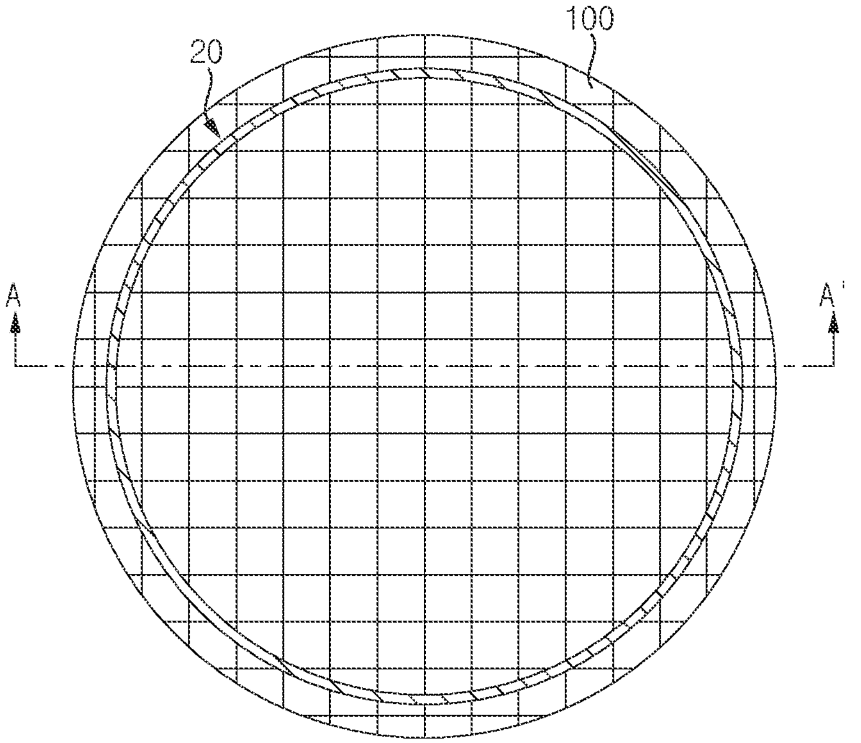
FIG. 3 is a plan view illustrating a first semiconductor substrate in which a trench is formed.
Figure 4:
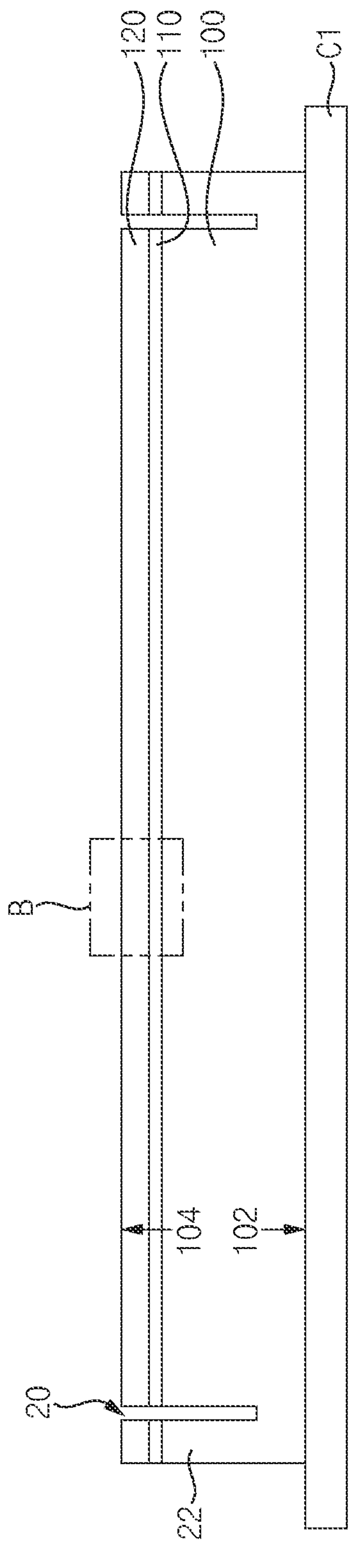
FIG. 4 is a cross-sectional view taken along the line A-A' in FIG. 3.
Figure 5:
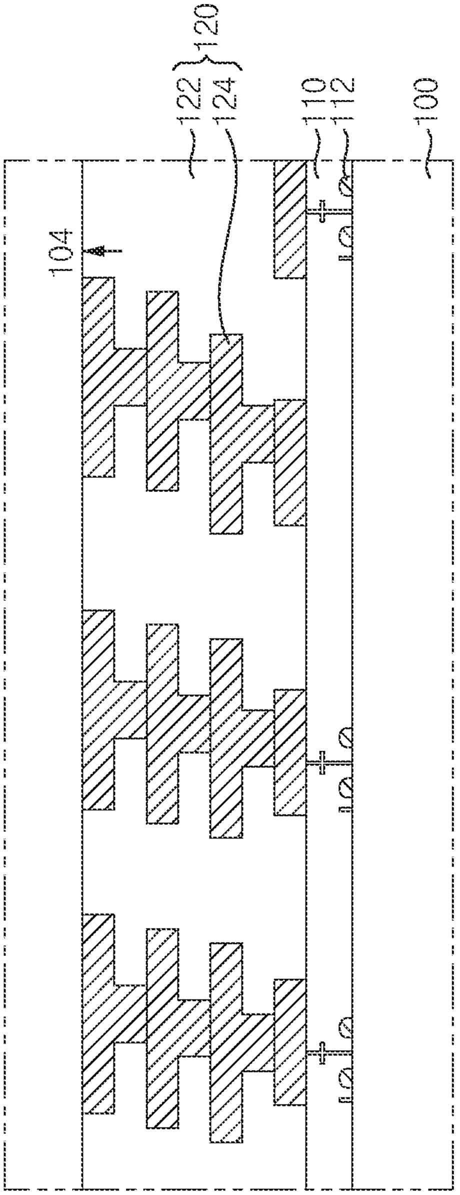
FIG. 5 is an enlarged cross-sectional view illustrating portion 'B' in FIG. 4.
Figure 6:
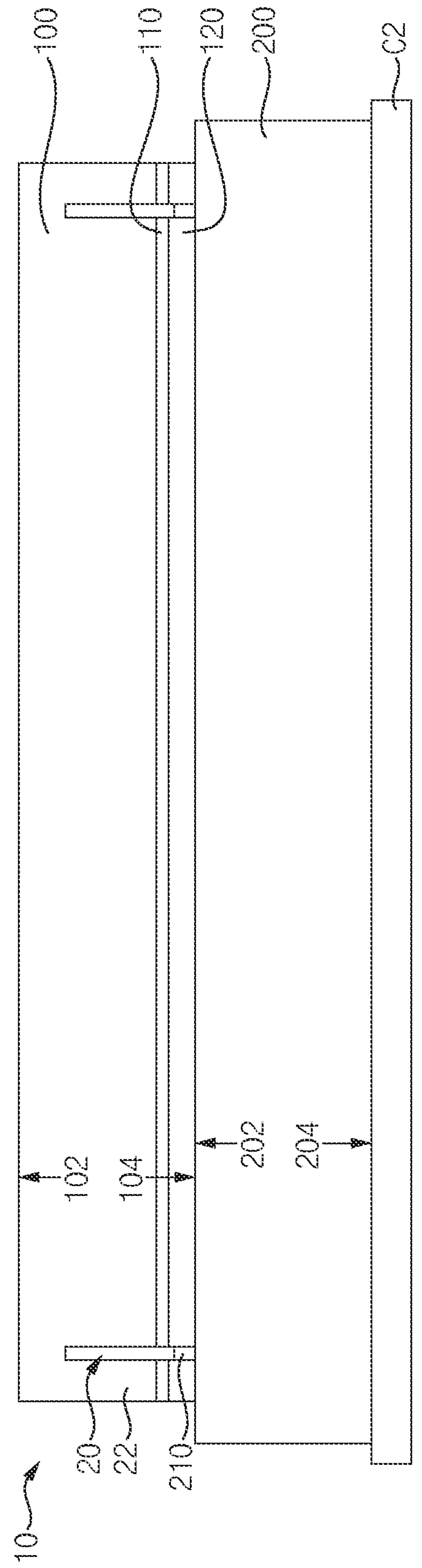
FIG. 6 is a view illustrating first and second semiconductor substrates bonded to each other.

FIG. 1 is a flowchart illustrating a method of manufacturing a semiconductor device in accordance with example embodiments. FIG. 2 is a front view illustrating a first semiconductor substrate in accordance with example embodiments. FIG. 3 is a plan view illustrating a first semiconductor substrate in which a trench is formed in accordance with example embodiments. FIG. 4 is a cross-sectional view taken along the line A-A' in FIG. 3 in accordance with example embodiments. FIG. 5 is an enlarged cross-sectional view illustrating portion 'B' in FIG. 4 in accordance with example embodiments. FIG. 6 is a view illustrating first and second semiconductor substrates bonded to each other in accordance with example embodiments.

Referring to FIGS. 1 to 6, first, in a method of manufacturing a semiconductor device, a first semiconductor substrate 100 may be bonded to a second semiconductor substrate 200 (S110), as illustrated in FIG. 6. In the method, the first semiconductor substrate 100 may be provided, at least one trench 20 may be formed in the first semiconductor substrate 100, and the first semiconductor substrate 100 may be bonded to the second semiconductor substrate 200 based on the trench. The first and second semiconductor substrates 100 and 200 may form the semiconductor device 10.

In example embodiments, the method may be referred to as a manufacturing process configured to increase reliability of the semiconductor device through a physical parameter measurement. The physical parameter measurement may include nanoindentation, or any other physical parameter measurements known to one of ordinary skill in the art. In the method, residual stresses may be advantageously measured from surfaces of a plurality of semiconductor substrates.

The method may obtain a wafer local stress between the plurality of semiconductor substrates bonded to each other through the nanoindentation. The plurality of semiconductor substrates may include the second semiconductor substrate 200, and the first semiconductor substrate 100 mounted on the second semiconductor substrate 200.

As an example implementation, the semiconductor device 10 formed through the method may have a backside power delivery network (BSPDN) structure. The BSPDN structure may have a structure configured to supply power from a backside of the semiconductor substrate. For example, the method may improve an overlay between the plurality of semiconductor substrates in the semiconductor device 10 that has the BSPDN structure. In the nanoindentation, an indenter may be press-fitted into a local test surface of a test body to obtain an indentation load and a deformation magnitude of the test surface. The nanoindentation may be referred to as a nano-unit indentation test method configured to determine an indentation degree and indentation modulus of the test body from the indentation load and the deformation magnitude of the test surface.

As illustrated in FIG. 2, according to one or more embodiments, the first semiconductor substrate 100 may have a first surface 102, and a second surface 104 opposite to the first surface 102. The first semiconductor substrate 100 may be provided on a carrier substrate C1. The first semiconductor substrate 100 may be disposed on the carrier substrate C1 such that the first surface 102 faces the carrier substrate C1.

In one or more examples, the second surface 104 of the first semiconductor substrate 100 may be referred to as an active side, and the first surface 102 may be referred to as an inactive side. An activation layer 110 and a redistribution wiring layer 120 may be provided on the second surface 104 of the first semiconductor substrate 100. The activation layer 110 may have one or more circuit elements. The activation layer 110 may be formed on the second surface 104 of the first semiconductor substrate 100 by performing a Fab process called a Front End of Line (FEOL) process for manufacturing semiconductor devices. The redistribution wiring layer 120 may be electrically connected to the activation layer 110. The second surface 104 may be referred to as a front side surface on which the circuit elements are formed, and the first surface 102 may be referred to as a backside surface.

For example, the first semiconductor substrate 100 may include a semiconductor material such as silicon, germanium, or silicon-germanium. The first semiconductor substrate 100 may include a group III-V compound semiconductor such as gallium phosphide (GaP), gallium arsenide (GaAs), or gallium antimonide (GaSb). The first semiconductor substrate 100 may be referred to as a silicon-on-insulator (SOI) substrate or a germanium-on-insulator (GOI) substrate.

The circuit elements may include transistors, diodes, or any other suitable circuit elements. Thus, the first semiconductor substrate 100 may be referred to as a semiconductor device having a plurality of circuit elements formed therein. The circuit elements of the first semiconductor substrate 100 may correspond to the circuit elements of the activation layer 110 discussed above.

As illustrated in FIGS. 3 and 4, in one or more examples, the trench 20 may be formed in the first semiconductor substrate 100. The second surface 104 of the first semiconductor substrate 100 may be etched to form the trench 20. The trench 20 may be formed at around an edge region of the first semiconductor substrate 100. A separation portion 22 may be formed in the edge region of the first semiconductor substrate 100 by the trench 20. For example, after the trench 20 is formed, the substrate 100 may be divided into an inner portion located from the center of the substrate to the trench 20, and the separation portion 22 located on from the trench to the edge of the substrate 100. As will be described later, the separation portion 22 may be removed by a polishing process. The trench 20 may be formed in a region of the first semiconductor substrate 100 where the circuit elements are not formed. The trench 20 may be formed by a trimming process.

As illustrated in FIG. 5, in one or more examples, the redistribution wiring layer 120 may be formed on the activation layer 110 of the first semiconductor substrate 100. The redistribution wiring layer 120 may include an insulating layer 122, and a plurality of redistribution wires 124 provided in the insulating layer. The circuit elements 112 of the activation layer 110 may be electrically connected to the redistribution wires 124 of the redistribution wiring layer 120.

The insulating layer 122 may include silicon oxide, carbon-doped silicon oxide, silicon carbonitride (SiCN), or any other suitable material known to one of ordinary skill in the art. The insulating layer 122 may include a polymer or a dielectric layer. The insulating layer 122 may be formed by a vapor deposition process, a spin coating process, or any other suitable material known to one of ordinary skill in the art. The redistribution wires 124 may include aluminum (Al), copper (Cu), tin (Sn), nickel (Ni), gold (Au), platinum (Pt), or an alloy thereof. The redistribution wires may be formed by a plating process, an electroless plating process, a vapor deposition process, or any other suitable process known to one of ordinary skill in the art.

As illustrated in FIG. 6, the first semiconductor substrate 100 may be bonded to the second semiconductor substrate 200. The second semiconductor substrate 200 may have a third surface 202 and a fourth surface 204 opposite to the third surface 202. The second semiconductor substrate 200 may be provided on a second carrier substrate C2.

In one or more examples, after the second semiconductor substrate 200 is attached on the first semiconductor substrate 100, a structure to which the second semiconductor substrate 200 is attached may be turned over (e.g., flipped), and the first carrier substrate C1 on the first surface 102 of the first semiconductor substrate 100 may be removed. In this case, the second surface 104 of the first semiconductor substrate 100 may be provided on the third surface 202 of the second semiconductor substrate 200.

In one or more examples, the second semiconductor substrate 200 may include a key 210 protruding from the third surface 202. The key 210 may be formed along an edge region of the second semiconductor substrate 100. The key 210 of the second semiconductor substrate 200 may be inserted into the trench 20 of the first semiconductor substrate 100. The trench 20 of the first semiconductor substrate 100 may be fixed on the second semiconductor substrate 200 through the key 210 of the second semiconductor substrate 200.

In one or more examples, the first and second semiconductor substrates 100 and 200 may be bonded to each other by a bonding process. The first and second semiconductor substrates 100 and 200 may receive heat and pressure by the bonding process. When the first semiconductor substrate 100 is bonded to the second semiconductor substrate 200, overlay distortion may be generated inside the first semiconductor substrate 100. The overlay distortion may be caused by the heat and the pressure. The overlay distortion may include position changes of the circuit elements 112 of the activation layer 110, and position changes of the redistribution wires 124 of the redistribution wiring layer 120. As a result, the overlay distortion may disadvantageously reduce the reliability of the semiconductor device 10.

The second semiconductor substrate 200 may include a sustain wafer capable of supporting the first semiconductor substrate 100. In this case, the first semiconductor substrate 100 may adhere to the third surface 202 of the second semiconductor substrate 200 through an adhesive member. For example, the adhesive member may include an epoxy compound or a phenol resin compound. The adhesive member may be formed by a vapor deposition process, a spin coating process, a sputtering process, or any other suitable process known to one of ordinary skill in the art, to be uniformly applied on the third surface 202 of the second semiconductor substrate 200.

Hereinafter, a process of obtaining first displacement data from the first surface of the first semiconductor substrate will be described.

Figure 7:
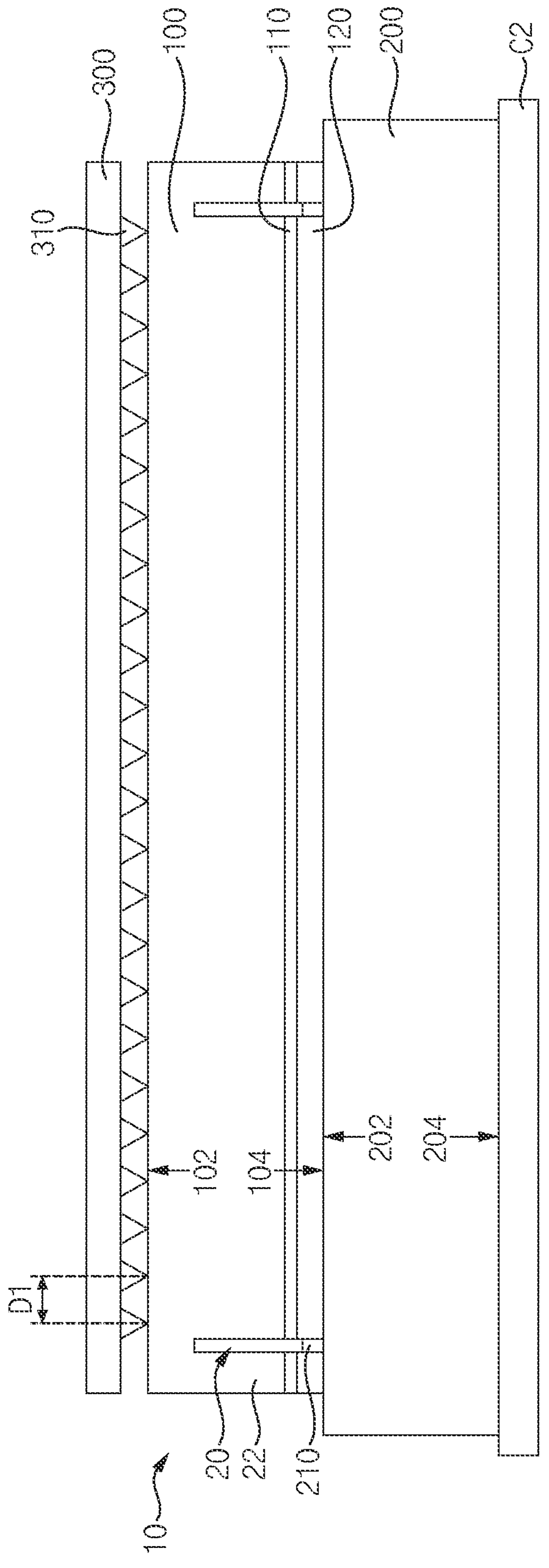
FIGS. 7 to 11 are views illustrating a process of obtaining first displacement data from a first surface of a first semiconductor substrate.
Figure 8A:
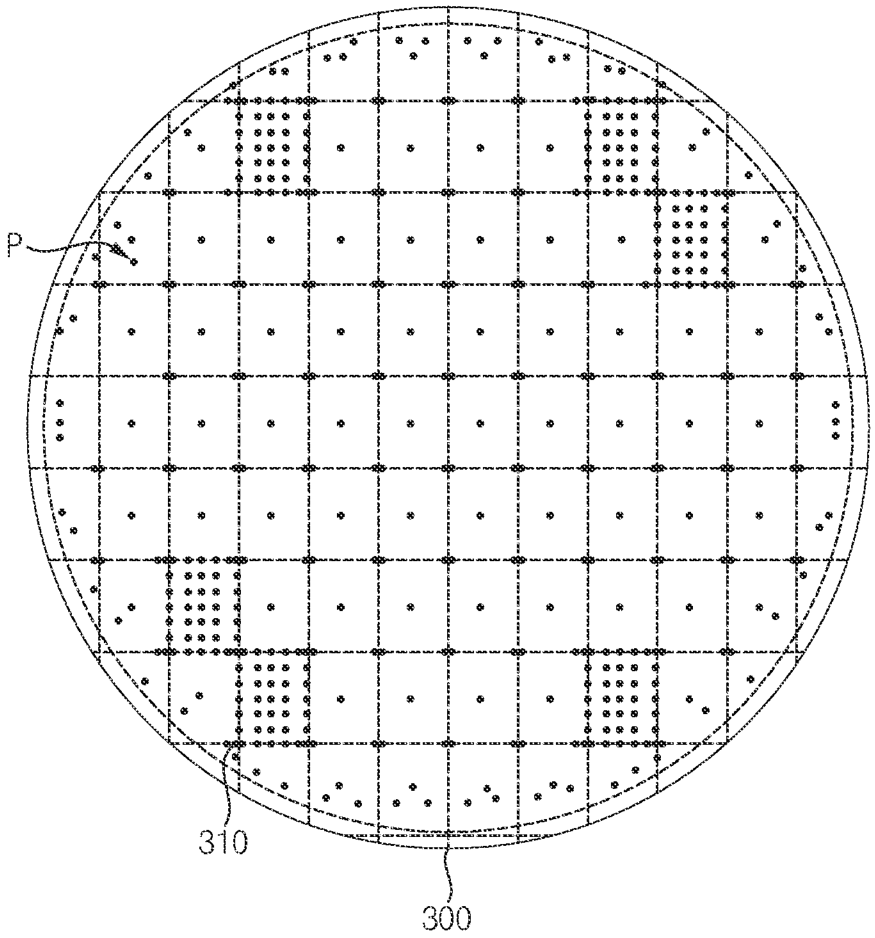
Figure 8B:
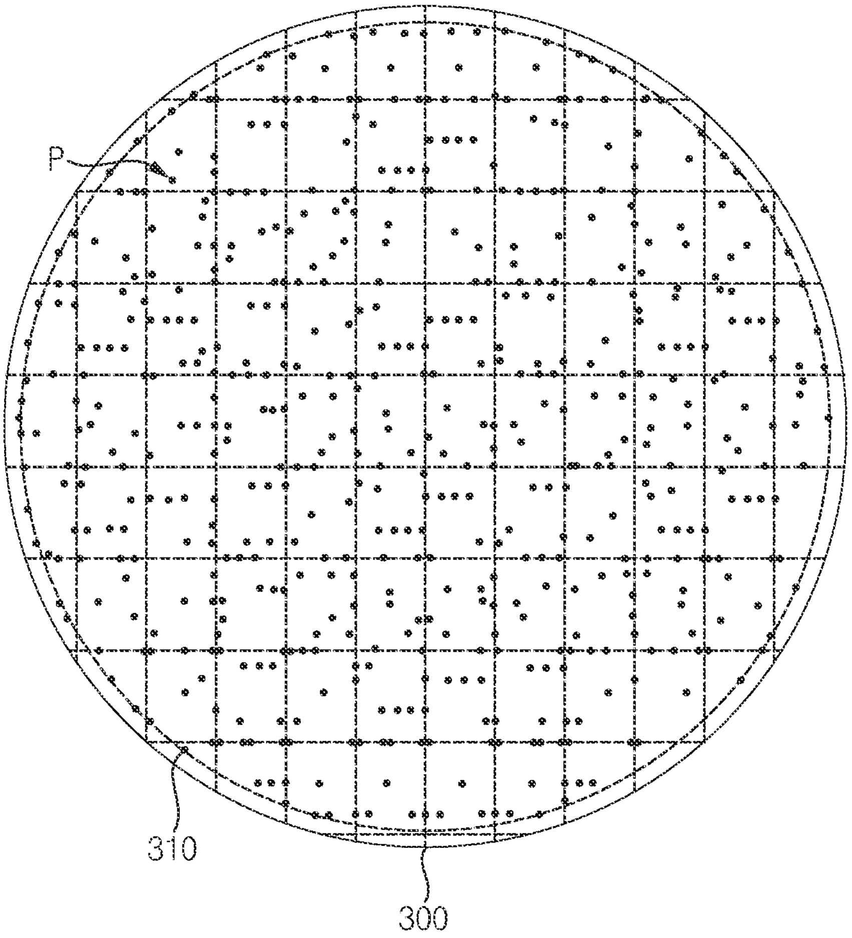
Figure 9:
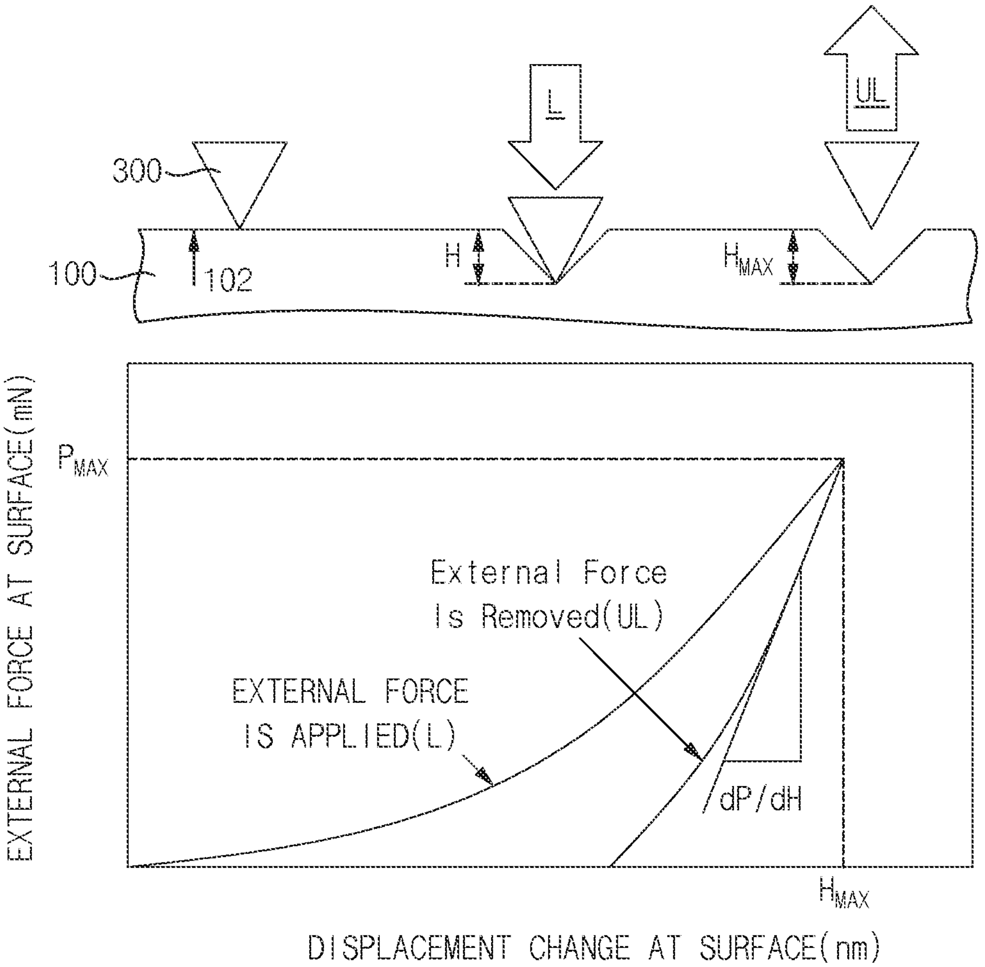
Figure 10:
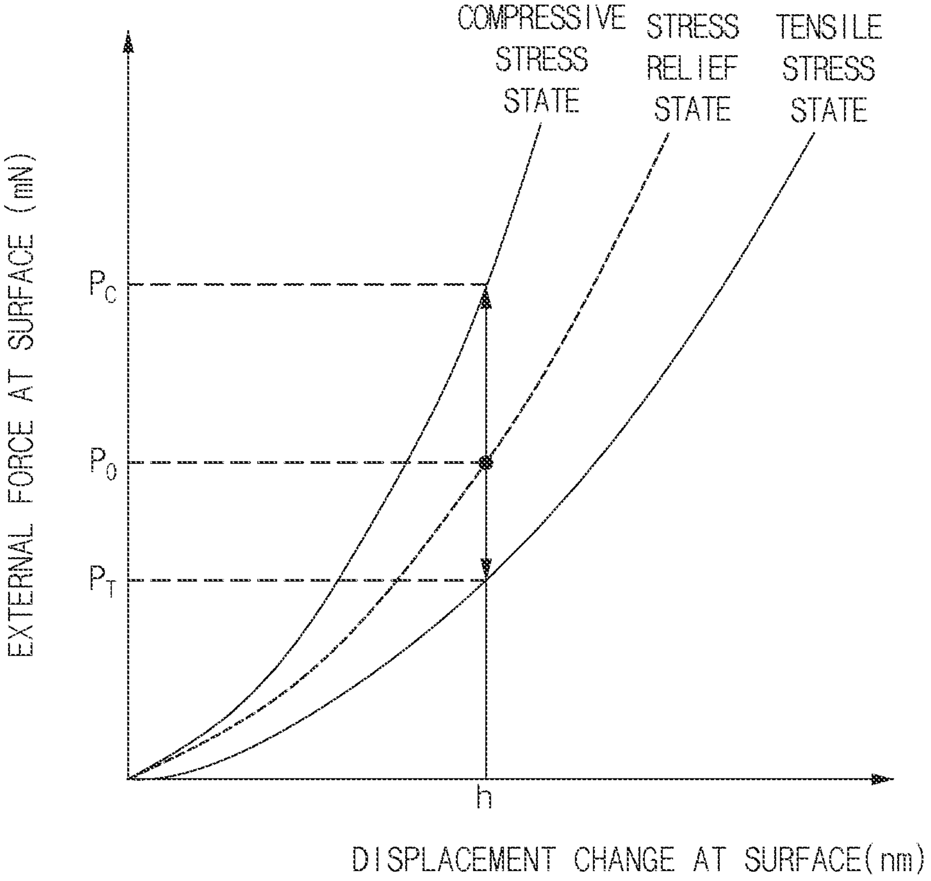
Figure 11:
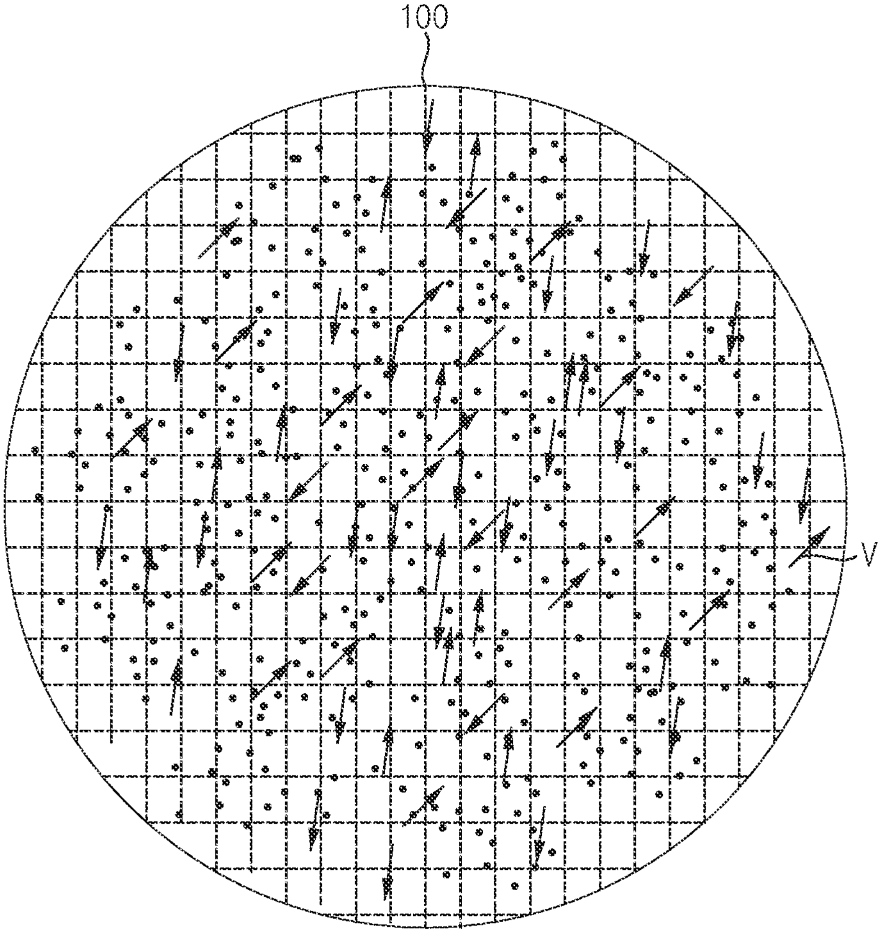

FIGS. 7 to 11 are views illustrating a process of obtaining first displacement data from a first surface of a first semiconductor substrate in accordance with one or more embodiments. FIG. 7 is a front view illustrating a nanoindentation plate having a plurality of probes provided on a first semiconductor substrate. FIGS. 8A and 8B are views illustrating points at which a first semiconductor substrate and a plurality of probes contact each other. FIG. 9 is a view illustrating a load-displacement curve according to a position of a probe in a process in which a first semiconductor substrate and the probe contact each other in accordance with one or more embodiments. FIG. 10 is a graph illustrating a change in a load-displacement curve according to residual stress in a process in which a first semiconductor substrate and a probe contact each other in accordance to one or more embodiments. FIG. 11 is a view illustrating a process of correcting overlay distortion that is generated in a process of bonding first and second semiconductor substrates.

Referring to FIGS. 1 and 7 to 11, the physical parameter measurement may be performed on the first surface 102 of the first semiconductor substrate 100 to obtain first displacement data (S120).

In example embodiments, the physical parameter measurement may include the nanoindentation. The nanoindentation may be performed through a nanoindentation plate 300 that has a plurality of probes 310. The nanoindentation plate 300 may include a circular shape similar to a shape of a semiconductor wafer. The nanoindentation plate 300 may reciprocate in a vertical direction on the semiconductor device 10 to perform the nanoindentation. The plurality of probes 310 may simultaneously contact the first surface 102 of the first semiconductor substrate 100 to obtain the first displacement data.

The plurality of probes 310 may be provided to face the first surface 102 of the first semiconductor substrate 100. The plurality of probes 310 may be spaced apart from each other by a predetermined distance D1. Since the plurality of probes 310 are densely arranged with each other through the predetermined distance D1, the residual stress may be measured in a local area. For example, the predetermined distance D1 may be within a range of 10 nm to 1 μm. The probe 310 may include a diamond tip.

As illustrated in FIG. 8A, in one or more examples, the plurality of probes 310 may be provided to be densely concentrated in a region where the residual stress remains the most on the first surface 102 of the first semiconductor substrate 100. The plurality of probes 310 may contact the first semiconductor substrate 100 to form a plurality of points. The point may be referred to as a contact point between the probe 310 and the first semiconductor substrate 100.

As will be described later, in one or more embodiments, a completed semiconductor device 10 may be cut along a scribe lane region. The completed semiconductor device 10 may be individually separated into a plurality of semiconductor chips by a sawing process. The plurality of probes 310 may be provided on the scribe lane area, and the plurality of points P may be formed on the scribe lane area. The plurality of probes 310 may be provided to be densely concentrated on a semiconductor chip that has a high defect occurrence frequency among the semiconductor chips. The plurality of points P may be formed on the semiconductor chip where the defect occurrence frequency is high.

As illustrated in FIG. 8B, in one or more examples, the plurality of probes 310 may be arranged on plate 300 to be distributed on the first surface 102 of the first semiconductor substrate 100. The plurality of probes 310 may be randomly provided on the first surface 102 of the first semiconductor substrate 100. The plurality of probes 310 may be provided at different positions according to a type of semiconductor device 10.

As illustrated in FIG. 9, in one or more examples, the plurality of probes 310 may obtain the first displacement data from the first surface 102 of the first semiconductor substrate 100. The first displacement data may include the residual stresses obtained from each of the plurality of probes 310. For example, the physical parameter measurement may obtain hardness, modulus of elasticity, creep, etc. of the first surface 102 of the first semiconductor substrate 100 through the first displacement data.

In one or more examples, the plurality of probes 310 may descend toward the first surface 102 of the first semiconductor substrate 100 through the nanoindentation plate 300. The plurality of probes 310 may contact the first surface 102 of the first semiconductor substrate 100. The plurality of probes 310 may receive an external force from the nanoindentation plate 300, and the external force may be transferred to the first surface 102 of the first semiconductor substrate 100.

In one or more examples, when the external force is transmitted to the probe 310, the probe 310 may apply the external force to the first semiconductor substrate 100. When the external force is applied, load on the first surface 102 of the first semiconductor substrate 100 may increase. When the external force is applied, a displacement change H may be generated on the first surface 102 of the first semiconductor substrate 100. The displacement change H may increase due to the external force.

The displacement change H may be generated on the first surface 102 of the first semiconductor substrate 100 due to the residual stress. When the external force reaches a maximum value, the probe 310 may be stopped. A maximum displacement change $H_{max}$ may be generated at a maximum external force $P_{max}$. In one or more examples, the residual stress may be referred to as stress that is generated in a process of bonding the first and second semiconductor substrates 100 and 200 to each other.

When the external force is removed from the probe 310, the maximum displacement change $H_{max}$ may be generated in the first semiconductor substrate 100. When the external force is removed, the displacement change H of the first surface 102 of the first semiconductor substrate 100 may decrease. When the external force is removed from the probe 310, stiffness may be obtained through a change of the external force P and the displacement change H. In one or more examples, the stiffness may be referred to as a hardness of the first surface 102 of the first semiconductor substrate 100.

As illustrated in FIG. 10, the residual stress may be obtained through the external force P and the displacement change H. The residual stress may be obtained through a load displacement curve. Based on stress relief state, the residual stress may be determined as a compressive stress state or a tensile stress state through the external force P and the displacement change H.

For example, the first displacement data may include a striker pressure, a chuck vacuum, and a bonding gap. In one or more examples, the striker pressure may be referred to as a pressure within a striker for forming a dielectric film on the semiconductor substrate. In one or more examples, the chuck vacuum may be referred to as electrostatic force of an electrostatic chuck that is applied to a substrate stage on which the semiconductor substrate is placed. In one or more examples, the bonding gap may be referred to as a space between the first and second semiconductor substrates 100 and 200 that is generated in the bonding process. The residual stress may be changed by the striker pressure, the chuck vacuum, and the bonding gap.

As illustrated in FIG. 11, the method may obtain vectors of the residual stresses through the first displacement data. The vector V may have a moving direction and force of the residual stress. The overlay between the first and second semiconductor substrates 100 and 200 may change due to the residual stress. The overlay distortion between the first and second semiconductor substrates 100 and 200 may be calculated through the vectors. The method may provide feedback to a bonding process of bonding other semiconductor substrates based on the first displacement data that has the residual stresses.

Figure 12:
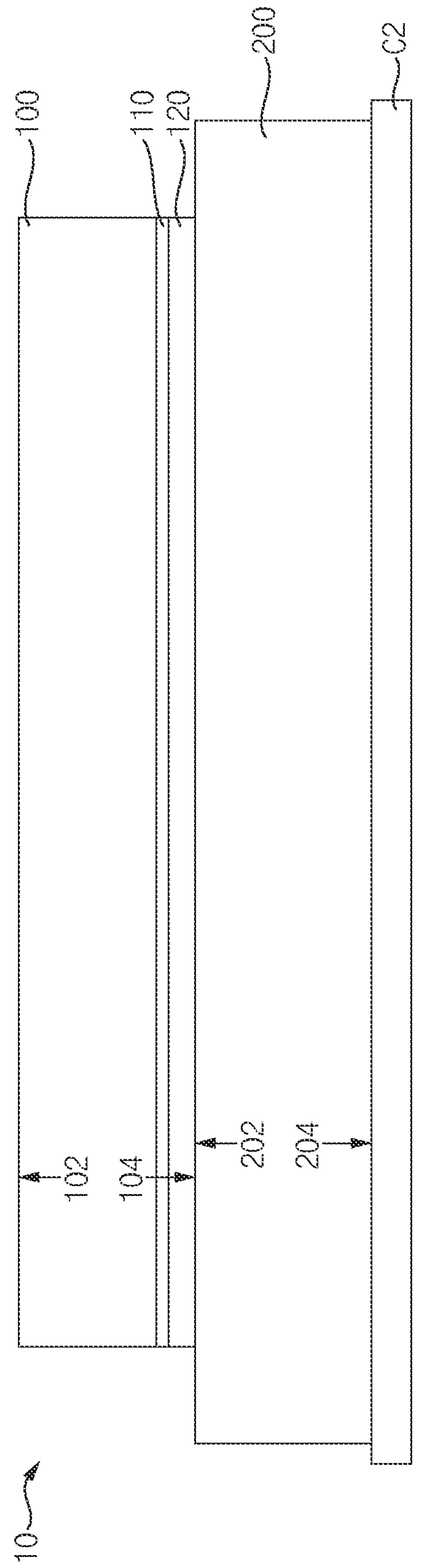
FIG. 12 is a view illustrating a first semiconductor substrate on which a polishing process is performed on a second semiconductor substrate.

FIG. 12 is a view illustrating a first semiconductor substrate on which a polishing process is performed.

Referring to FIG. 12, the first surface 102 of the first semiconductor substrate 100 may be polished by the polishing process (S130).

In example embodiments, the first surface 102 of the first semiconductor substrate 100 may be partially removed by a grinding process such as a chemical mechanical polishing (CMP) process. Thus, a thickness of the first semiconductor substrate 100 may be reduced to a desired thickness. For example, the separation portion formed by the trench of the first semiconductor substrate 100 may be removed through the polishing process.

The displacement change formed on the first surface 102 of the first semiconductor substrate 100 in the process of obtaining the first displacement data may be removed by the polishing process. In this regard, the displacement change used to obtain the first displacement data may be removed by the polishing process. Since the displacement change is removed, the process of obtaining the first displacement data might not affect the manufacturing process of the semiconductor device 10.

Figure 13:
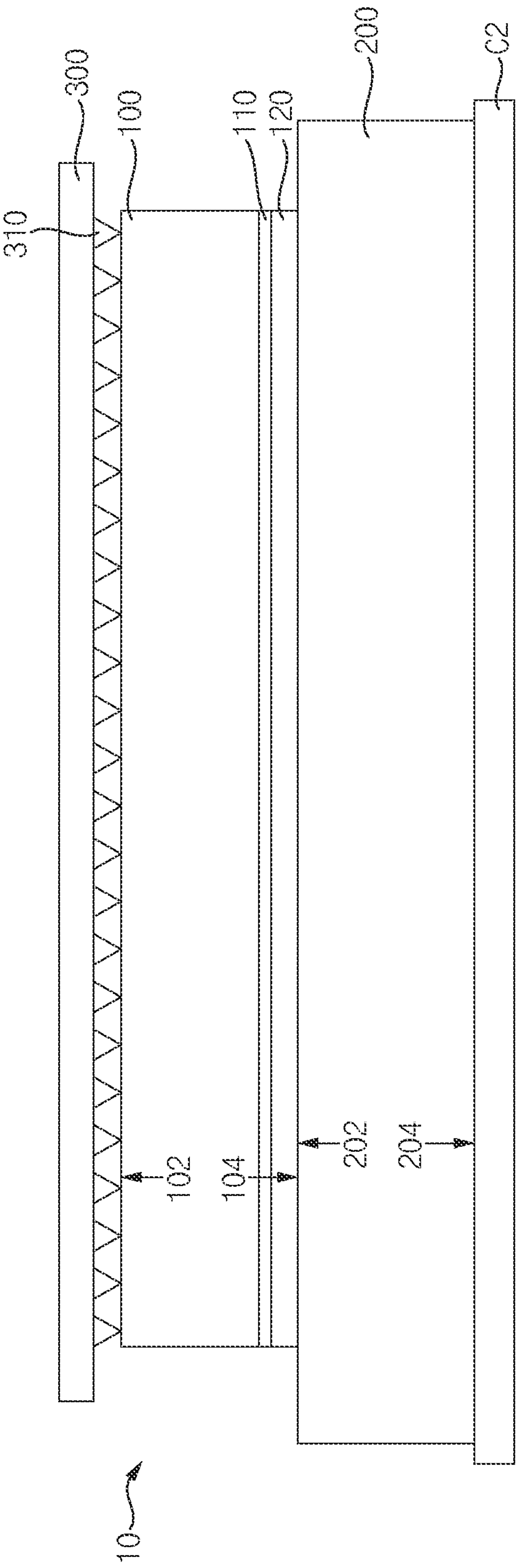
FIG. 13 is a view illustrating a process of obtaining second displacement data from a polished first surface of a first semiconductor substrate.

FIG. 13 is a view illustrating a process of obtaining second displacement data from a first semiconductor substrate.

Referring to FIGS. 1, 7 to 11, and 13, processes the same as or similar to the processes described with reference to FIGS. 7 to 11 may be performed on the polished first surface 102 of the first semiconductor substrate 100 to obtain second displacement data by the physical parameter measurement (S140).

The plurality of probes 310 may obtain the second displacement data from the polished first surface 102 of the first semiconductor substrate 100. The second displacement data may include residual stresses that are obtained from the plurality of probes 310. For example, the physical parameter measurement may obtain hardness, modulus of elasticity, and creep of the polished first surface 102 of the first semiconductor substrate 100 through the second displacement data.

The plurality of probes 310 may descend toward the polished first surface 102 of the first semiconductor substrate 100 through the nanoindentation plate 300. The plurality of probes 310 may contact the polished first surface 102 of the first semiconductor substrate 100. The plurality of probes 310 may receive an external force P from the nanoindentation plate 300, and the external force may be transferred to the polished first surface 102 of the first semiconductor substrate 100.

The displacement change H may be generated on the polished first surface 102 of the first semiconductor substrate 100 due to the residual stress. When the external force P is removed from the probe 310, the maximum displacement change $H_{max}$ may be generated in the first semiconductor substrate 100. When the external force P is removed, the displacement change H of the polished first surface 102 of the first semiconductor substrate 100 may decrease. The residual stress may be obtained through the external force P and the displacement change H. For example, the second displacement data may include a striker pressure, a chuck vacuum, and a bonding gap.

The method may obtain the vectors of the residual stresses through the second displacement data. The vector may have the moving direction and the force of the residual stress. The overlay between the first and second semiconductor substrates 100 and 200 may change due to the residual stress. The method may provide a feedforward to a process of forming circuit patterns on the first semiconductor substrate 100 based on the second displacement data that has the residual stresses.

Figure 14:
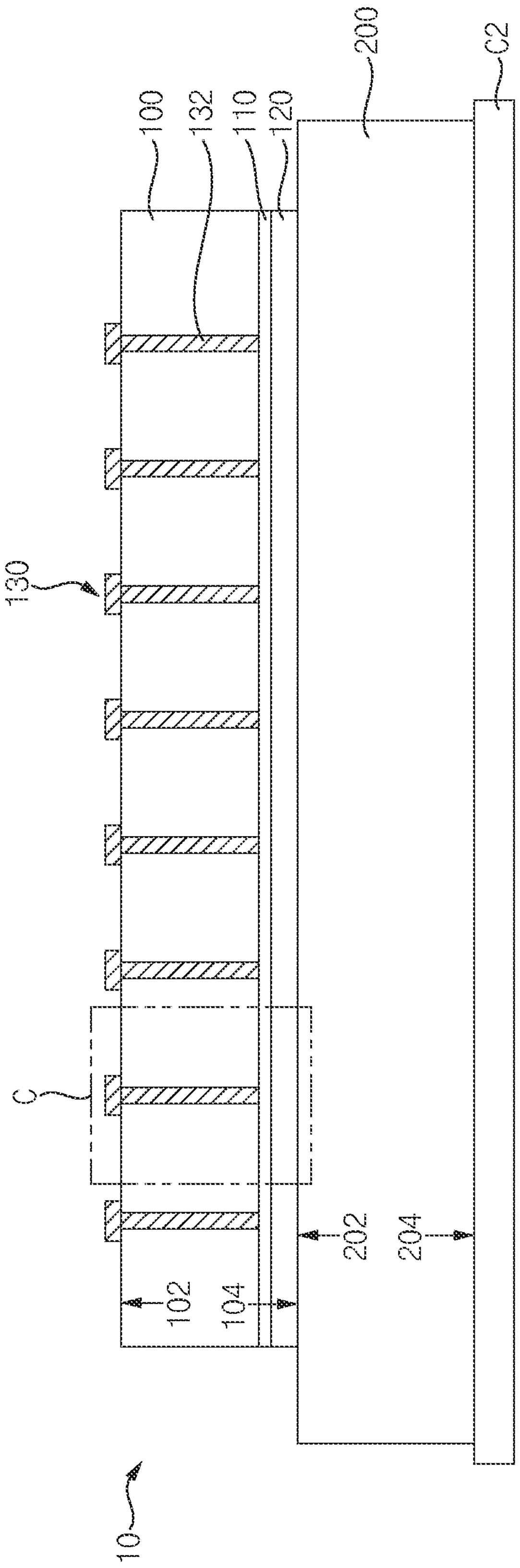
FIG. 14 is a view illustrating circuit patterns formed on a first semiconductor substrate.
Figure 15:
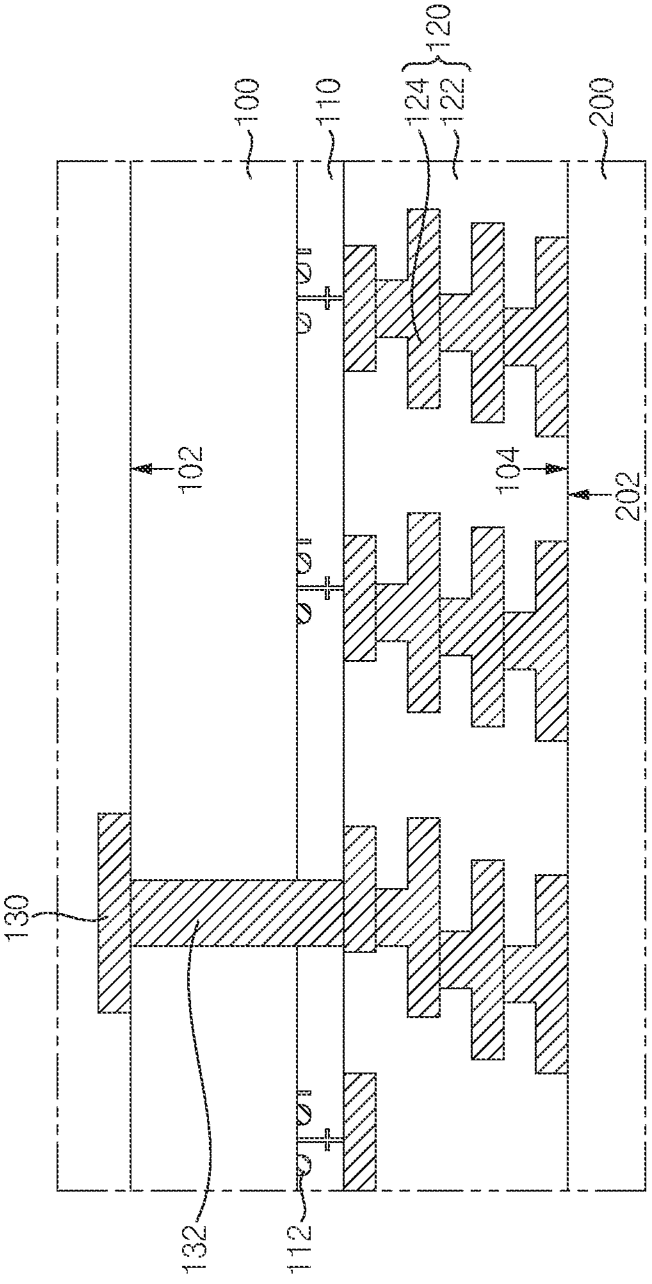
FIG. 15 is an enlarged cross-sectional view illustrating portion 'C' in FIG. 14.

FIG. 14 is a view illustrating circuit patterns formed on a first semiconductor substrate. FIG. 15 is an enlarged cross-sectional view illustrating portion 'C' in FIG. 14.

Referring to FIGS. 14 and 15, the circuit patterns 130 may be formed on the polished first surface 102 of the first semiconductor substrate 100 based on the second displacement data (S150).

In example embodiments, the circuit patterns 130 may be formed on the polished first surface 102 of the first semiconductor substrate 100 based on the second displacement data. The circuit patterns 130 may include any type of electronic element or component known to one of ordinary skill in the art that may be formed on the first semiconductor substrate 100.

For example, the circuit patterns 130 may include a power pattern configured to supply power to the circuit elements 112 of the activation layer 110. The circuit patterns 130 may include through silicon vias 132 that are electrically connected to the circuit elements 112 of the activation layer 110.

In the polishing process, the overlay between the first and second semiconductor substrates 100 and 200 may be changed. In the polishing process, positions of the circuit elements 112 of the activation layer 110 and the redistribution wires 124 of the redistribution wiring layer 120 may be changed. The second displacement data may have a change of the overlay that is generated in the polishing process. The second displacement data may have position changes of the circuit elements 112 and the redistribution wires 124.

The circuit patterns 130 may be formed on the polished first surface 102 of the first semiconductor substrate 100 based on the second displacement data. The circuit patterns 130 may be formed to overlay the redistribution wires 124 of the redistribution wiring layer 120 or the circuit elements 112 of the activation layer 110 based on the second displacement data. The circuit patterns 130 may be formed to have a high overlay degree with the redistribution wires 124 or circuit elements 112 based on the second displacement data. Since the circuit patterns 130 have the high overlay degree with the redistribution wires 124 or circuit elements 112, the reliability of the semiconductor device 10 may be improved.

The circuit patterns 130 may be formed on the polished first surface 102 of the first semiconductor substrate 100 based on the displacement change that is formed on the polished first surface 102 in the process of obtaining the second displacement data. Since the displacement change is reflected on the circuit patterns 130, the process of obtaining the second displacement data does not adversely affect the manufacturing process of the semiconductor device 10.

After forming the circuit patterns, a third semiconductor substrate may be bonded to a fourth semiconductor substrate to minimize an overlay change between the third and fourth semiconductor substrates based on the first displacement data (S160).

In example embodiments, the first displacement data may be used in a process of bonding the third and fourth semiconductor substrates. The first displacement data may include the residual stress that is generated in the first and second semiconductor substrates 100 and 200. For example, the third and fourth semiconductor substrates may include semiconductor substrates of the same type as the first and second semiconductor substrates 100 and 200.

The method may bond the third and fourth semiconductor substrates by reflecting the residual stress. Since the method bonds the third and fourth semiconductor substrates by reflecting the residual stress, precision of the semiconductor device 10 may be improved. For example, the third and fourth semiconductor substrates may be bonded to each other by the bonding process.

The third semiconductor substrate may have a fifth surface and a sixth surface opposite to the fifth surface. The sixth surface of the third semiconductor substrate may be referred to as an active surface, and the fifth surface may be referred to as an inactive surface. The sixth surface may be referred to as a front side surface on which the circuit elements are formed, and the fifth surface may be referred to as a backside surface. For example, the sixth surface of the third semiconductor substrate may be bonded to an upper surface of the fourth semiconductor substrate in the same way that the second surface 104 of the first semiconductor substrate 100 is bonded to the third surface 202 of the second semiconductor substrate 200.

Then, the completed semiconductor device 10 may be cut along the scribe lane area. The completed semiconductor device 10 may be individually separated into the plurality of semiconductor chips by the sawing process.

As described above, the overlay between the first and second semiconductor substrates 100 and 200 may be measured by the physical parameter measurement. The first semiconductor substrate 100 may have the circuit elements 112 formed on the second surface 104 opposite to the first surface 102. The overlay between the circuit elements 112 and the circuit patterns 130 may be measured by the physical parameter measurement.

Since the physical parameter measurement directly contact the first surface 102 of the first semiconductor substrate 100 to obtain the first and second displacement data, the overlays may be measured more accurately. Since the nanoindentation obtains the first and second displacement data from the first surface 102 through the plurality of probes 310 that are disposed at narrow intervals, the first and second displacement data may be obtained from the local area.

Also, the first displacement data may be used as feedback data in the process of bonding the third and fourth semiconductor substrates. The first displacement data may include the residual stress that is applied on the first semiconductor substrate 100, and accuracy of the overlay may be improved in the process of bonding the third and fourth semiconductor substrates through the residual stress. The second displacement data may be used as feedforward data in the process of forming the circuit patterns 130 on the polished first surface 102 of the first semiconductor substrate 100. Reliability of the circuit patterns 130 may be improved based on the second displacement data.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method of manufacturing a semiconductor device, the method comprising:

bonding a first semiconductor substrate on a second semiconductor substrate;

performing a first physical parameter measurement on a first surface of the first semiconductor substrate to obtain first displacement data by applying a force to the first surface in a direction perpendicular to the first surface;

polishing the first surface of the first semiconductor substrate after the first displacement data is obtained;

performing a second physical parameter measurement on the polished first surface of the first semiconductor substrate to obtain second displacement data; and forming circuit patterns on the polished first surface of the first semiconductor substrate based on the second displacement data.

2. The method of claim 1, further comprising:

bonding a third semiconductor substrate onto a fourth semiconductor substrate based on the first displacement data to reduce an overlay change between the third semiconductor substrate and the fourth semiconductor substrate, wherein the third semiconductor substrate and the fourth semiconductor substrate comprise semiconductor substrates of a same type as the first semiconductor substrate and the second semiconductor substrate.

3. The method of claim 1, wherein bonding the first semiconductor substrate comprises:

bonding the first semiconductor substrate such that a second surface of the first semiconductor substrate opposite to the first surface faces the second semiconductor substrate, a plurality of circuit elements and redistribution wires electrically connected to the plurality of circuit elements being formed on the second surface, and wherein the forming the circuit patterns comprises, forming the circuit patterns such that the circuit patterns are overlaid with the plurality of circuit elements or the redistribution wires based on the second displacement data.

4. The method of claim 3, wherein the forming the circuit patterns further comprises forming through silicon vias that are electrically connected to the plurality of circuit elements or the redistribution wires.

5. The method of claim 3, wherein the circuit patterns comprise power supply patterns that are configured to supply power to the plurality of circuit elements.

6. The method of claim 1, wherein the first physical parameter measurement and the second physical parameter measurement comprise a nanoindentation measurement that is able to obtain the first displacement data and the second displacement data, respectively, from the first surface using a plurality of probes spaced apart by a predetermined distance.

7. The method of claim 6, wherein the predetermined distance is within a range of 10 nm to 1 μm.

8. The method of claim 6, wherein the probes simultaneously contact the first surface to obtain the first displacement data and the second displacement data, respectively.

9. The method of claim 1, wherein the first physical parameter measurement and the second physical parameter measurement obtain the first displacement data and the second displacement data, respectively, by measuring residual stresses on the first surface.

10. The method of claim 1, wherein the polishing the first surface comprises removing a first change in a displacement that is applied on the first surface in a process of obtaining the first displacement data, and wherein the forming the circuit patterns comprises reflecting a second change in a displacement that is applied on the polished first surface in a process of obtaining the second displacement data to form the circuit patterns.

11. A method of manufacturing a semiconductor device, the method comprising:

bonding a first semiconductor substrate onto a second semiconductor substrate;

performing a first physical parameter measurement on a first surface of the first semiconductor substrate to obtain first displacement data, the first displacement data indicating a residual stress of the first surface;

polishing the first surface of the first semiconductor substrate after the first displacement data is obtained;

performing a second physical parameter measurement on the polished first surface of the first semiconductor substrate to obtain second displacement data, the second displacement data indicating residual stress of the polished first surface; and forming circuit patterns on the polished first surface of the first semiconductor substrate based on the second displacement data.

12. The method of claim 11, wherein further comprising bonding a third semiconductor substrate onto a fourth semiconductor substrate based on the first displacement data to reduce an overlay change between the third semiconductor substrate and the fourth semiconductor substrate, wherein the third semiconductor substrate and the fourth semiconductor substrate comprise semiconductor substrates of a same type as the first semiconductor substrate and the second semiconductor substrate.

13. The method of claim 11, wherein bonding the first semiconductor substrate comprises:

bonding the first semiconductor substrate such that a second surface of the first semiconductor substrate opposite to the first surface faces the second semiconductor substrate, a plurality of circuit elements and redistribution wires electrically connected to the plurality of circuit elements being formed on the second surface, and wherein the forming the circuit patterns comprises, forming the circuit patterns such that the circuit patterns are overlaid with the plurality of circuit elements or the redistribution wires based on the second displacement data.

14. The method of claim 13, wherein the forming the circuit patterns further comprises forming through silicon vias that are each electrically connected to the plurality of circuit elements or the redistribution wires.

15. The method of claim 13, wherein the circuit patterns comprise power supply patterns that are configured to supply power to the plurality of circuit elements.

16. The method of claim 11, wherein the first physical parameter measurement and the second physical parameter measurement comprise a nanoindentation measurement that is able to obtain the first displacement data and the second displacement data, respectively, from the first surface using a plurality of probes spaced apart by a predetermined distance.

17. The method of claim 16, wherein the predetermined distance is within a range of 10 nm to 1 μm.

18. The method of claim 16, wherein the plurality of probes simultaneously contact the first surface to obtain the first displacement data and the second displacement data, respectively.

19. The method of claim 11, wherein polishing the first surface comprises removing a first change in a displacement that is applied on the first surface in a process of obtaining the first displacement data, and wherein the forming the circuit patterns comprises reflecting a second change in a displacement that is applied on the polished first surface in a process of obtaining the second displacement data to form the circuit patterns.

20. A method of manufacturing a semiconductor device, the method comprising:

bonding a plurality of semiconductor substrates to each other;

obtaining first displacement data indicating a residual stress of a surface from any one surface selected from among the plurality of semiconductor substrates through a physical parameter measurement;

polishing the surface of a semiconductor substrate from the plurality of semiconductor substrates such that a displacement change applied on the surface in a process of obtaining the first displacement data is removed;

obtaining second displacement data indicating a residual stress of the polished surface from the polished surface of the semiconductor substrate through the physical parameter measurement;

forming circuit patterns on the polished surface of the semiconductor substrate based on the second displacement data and displacement changes that are applied on the polished surface in a process of obtaining the second displacement data; and bonding a plurality of different semiconductor substrates to each other based on the first displacement data.

* * * * *